US007138746B2

(12) United States Patent
Taniguchi

(10) Patent No.: US 7,138,746 B2
(45) Date of Patent: Nov. 21, 2006

(54) SURFACE ACOUSTIC WAVE APPARATUS AND COMMUNICATION APPARATUS

(75) Inventor: Norio Taniguchi, Shiga-ken (JP)

(73) Assignee: Murata Manufaturing Co., Ltd., Kyoto (JP)

( * ) Notice: Subject to any disclaimer, the term of this patent is extended or adjusted under 35 U.S.C. 154(b) by 260 days.

(21) Appl. No.: 10/132,285

(22) Filed: Apr. 26, 2002

(65) Prior Publication Data
US 2002/0180308 A1 Dec. 5, 2002

(30) Foreign Application Priority Data
Apr. 26, 2001  (JP) .............................. 2001-130261

(51) Int. Cl.
*H01L 41/08* (2006.01)
(52) U.S. Cl. .................................. 310/313 R; 310/344
(58) Field of Classification Search ............ 310/313 A, 310/313 B; 333/133, 193
See application file for complete search history.

(56) References Cited

U.S. PATENT DOCUMENTS 4,737,742 A * 4/1988 Takoshima et al. ......... 333/150
5,515,015 A * 5/1996 Nakata ....................... 333/133
6,037,847 A * 3/2000 Ueda et al. ................. 333/193
6,057,744 A * 5/2000 Ikada .......................... 333/133
6,115,592 A    9/2000 Ueda et al. ................. 333/126
6,222,426 B1 * 4/2001 Komazaki et al. .......... 333/133

FOREIGN PATENT DOCUMENTS

| EP | 0 898 363 A2 | 2/1999 |
| JP | 05-167388 | 7/1993 |
| JP | 7-226607 | 8/1995 |
| JP | 10-313229 | 11/1998 |
| JP | 2002-280874 | 9/2002 |
| WO | WO 98/51010 | 11/1998 |

* cited by examiner

*Primary Examiner*—Mark Budd
(74) *Attorney, Agent, or Firm*—Keating & Bennett, LLP

(57) ABSTRACT

A surface acoustic wave apparatus includes a first filter and a second filter, which are integrated into one package, and, filter signal terminals of the first and second filters are connected to package signal terminals of the package through different paths which are insulated from each other. A signal line extended from filter signal terminals is connected to one common terminal outside the package. The signal line and the common terminal define a coupling section. An inductance device is connected in parallel to the coupling section as a matching circuit.

20 Claims, 16 Drawing Sheets

SURFACE ACOUSTIC WAVE APPARATUS AND COMMUNICATION APPARATUS

BACKGROUND OF THE INVENTION

1. Field of the Invention

The present invention relates to surface acoustic wave apparatuses and communication apparatuses, and more particularly, to a surface acoustic wave apparatus for use in, for example, a surface acoustic wave multiplexer and a communication apparatus including such a surface acoustic wave apparatus.

2. Description of the Related Art

Surface acoustic wave apparatuses are provided with a surface acoustic wave device which utilizes a surface acoustic wave propagating along a surface of a piezoelectric member, and are used for delay lines, filters, resonators, and other apparatuses. Since surface acoustic waves have shorter wavelengths than electromagnetic waves, it is easy to reduce the size of surface acoustic wave apparatuses. Therefore, surface acoustic wave apparatuses are used for filters provided in high-frequency circuits, for example, in portable telephones.

Recently, mobile-communication units such as portable telephones have been required to be made more compact and to have a lower profile. Therefore, surface acoustic wave apparatuses must also be made more compact and to have a lower profile. In portable telephones, to perform transmission and receiving at different frequency bands with the use of one antenna, surface acoustic wave apparatuses have been increasingly used as multiplexers (branch filters).

An example of a surface acoustic wave apparatus used for a surface acoustic wave multiplexer is disclosed in (i) Japanese Unexamined Patent Publication No. 05-167388. In this technology, as shown in FIG. 17, a plurality of surface acoustic wave resonators (hereinafter referred to simply as resonators) is provided to define ladder-type surface acoustic wave filters (hereinafter referred to as filters) and two of such filters are connected in parallel to define a multiplexer.

More specifically, in the multiplexer, ladder-type filters Fi and Fii each formed by alternately connecting series resonators S and a parallel resonator P are provided, and the filters are connected in parallel at a common terminal To. The filter Fii has higher pass-band frequencies than the filter Fi. If the multiplexer is used for a communication apparatus, the filter Fii is used as a receiving filter and the filter Fi is used as a transmission filter.

When two surface acoustic wave filters define a multiplexer as described above, the following filter characteristic (impedance characteristic) is required for the filter Fi. The filter Fi must have an impedance that is close to that of the entire circuit in the pass band and a much higher impedance than that of the entire circuit in a blocking band, which is the pass band of the filter Fii. Since it is not easy for conventional transversal surface acoustic wave filters to have such a filter characteristic, the circuit structure of the entire multiplexer is complicated.

In contrast, in the device disclosed in the above-described publication (i), since resonators Si and Sii that are disposed closest to the common terminal are series resonators connected in series, the series resonators are used to match the impedance characteristics of the filters and also for phase adjustment in the entire multiplexer. Therefore, the impedance is much higher than the circuit impedance in the blocking bands, other than the pass band, to achieve the required impedance characteristic.

In the multiplexer having the above-described structure, in the pass band of one filter, the other filter functions as a capacitive device connected in parallel. When an inductance device L having an inductance to cancel the capacitance of the capacitive device (the other filter) is connected in parallel close to the common terminal To, as shown in FIG. 17, the capacitive-device function of the other filter is canceled and matching is provided, for example, at 50Ω.

An example of a filter defining a parallel capacitive device, as described above, used for a multi-terminal-pair surface acoustic wave filter is disclosed in (ii) Japanese Unexamined Patent Publication No. 10-313229. In this filter, an inductance device is connected in parallel close to a common terminal for matching. In addition, the surface acoustic wave filter is designed so as to be parallel-resonant with the parallel inductance device. Only a single inductance device is provided as a matching circuit to prevent an effect of the other filter.

In the above-described conventional devices, the above-described matching is obtained theoretically. When such a surface acoustic wave multiplexer is integrated into one package for compactness and mounted as a device, however, matching cannot be sufficiently made due to a series parasitic component.

Specifically, when a multiplexer having the above-described structure is integrated into one package and mounted, as shown in FIG. 18, a series parasitic impedance component $Z_0$ caused by striplines connected to the filters Fi and Fii is formed between the signal terminals of the filters Fi and Fii and a matching circuit (parallel inductance device L) at the common-terminal side. If such a parasitic component is included, the impedance of the multiplexer is shifted toward a lower-impedance side. Matching cannot be achieved with only the inductance device L being provided.

More specifically, it is assumed that matching is made at 50Ω in the pass band fi of the filter Fi without additionally providing the filter Fii or the matching circuit. Since the filter Fii functions as a capacitive device in its pass band fii, the impedance characteristic of the filters Fi and Fii, viewed from a connection point $P_0$ where the filters are connected, is obtained by the filter Fi having a matching of 50Ω and a parallel capacitor.

In an admittance chart, the admittance of the filter Fi is changed from a point A to a point B, as shown in FIG. 19. In the admittance chart, since an upper semi-circle indicates an inductive admittance, and a lower semicircle indicates a capacitive admittance, the admittance of the filter Fi is capacitive on an equal-conductance circle.

Therefore, if the above-described series parasitic impedance component $Z_0$ is not present between the connection point $P_0$ and the inductance device L, matching could be made at 50Ω in the filter Fi by providing the inductance device L only. As a result, in the admittance chart shown in FIG. 19, the admittance of the filter Fi is changed from the point B to the point A by setting the inductance of the inductance device L to an appropriate value.

Actually, the above-described series parasitic impedance component $Z_0$ is present between the filter Fi and the inductance device L, as shown in FIG. 18. Therefore, the phase is shifted toward a lower impedance side. In the admittance chart shown in FIG. 19, the admittance of the filter Fi is changed from the point B to a point C on an equal-susceptance circle D. Consequently, matching cannot be achieved at 50Ω by providing only the inductance device L. The admittance of the filter Fi can be changed only on the equal-susceptance circle D.

To solve the foregoing problem caused by the parasitic component, it is necessary to provide, in addition to the parallel inductance device L, another matching device, such as a series capacitive device or a series stripline, as a matching circuit. As a result, the number of matching devices is increased, and the size of the multiplexer is increased.

SUMMARY OF THE INVENTION

In order to overcome the problems described above, preferred embodiments of the present invention provide a low-matching-loss surface acoustic wave apparatus including a reduced number of matching devices even when two surface acoustic wave filters are integrated into one package, and provide a communication apparatus including such a novel surface acoustic wave apparatus.

According to one preferred embodiment of the present invention, a surface acoustic wave apparatus includes a first surface acoustic wave filter having relatively low pass-band frequencies, and a second surface acoustic wave filter having relatively high pass-band frequencies, wherein the first and second surface acoustic wave filters are integrated into one package, one signal terminal of each surface acoustic wave filter is connected through a common terminal, and the signal terminals, disposed at the common terminal sides, of the respective surface acoustic wave filters are connected to different external terminals of the package through different paths that are isolated from each other, and each of the signal terminals is connected by a signal line of an external circuit.

In the above-described structure, the two surface acoustic wave filters having different pass bands are integrated into one package, and signal terminals of the surface acoustic wave filters are separately provided. Therefore, since a series parasitic component generated between a connection point (coupling section) and a point where a matching device is connected is substantially eliminated, the structure of the matching device is simplified. As a result, because it is not necessary to provide additional matching devices, the size of the surface acoustic wave apparatus is greatly reduced. A surface acoustic wave apparatus according to preferred embodiments of the present invention can be utilized for a multiplexer in a communication apparatus.

The surface acoustic wave apparatus is preferably configured such that the surface acoustic wave filters are connected to the common terminal through a transmission line outside the package, the common terminal and the line define a coupling section, and matching device is connected in parallel to the surface acoustic wave filters at the coupling section.

According to the above-described preferred embodiment, since the coupling section is provided outside the package, the above-described series parasitic component is eliminated. Therefore, the matching device is made more compact. As a result, a surface acoustic wave apparatus and a multiplexer including the surface acoustic wave apparatus is made more compact.

The surface acoustic wave apparatus is preferably configured such that the matching device includes an inductive device which provides inductiveness in the pass bands of the surface acoustic wave filters.

The surface acoustic wave apparatus further preferably configured such that the inductive device is an inductance device, and the matching device includes only the inductance device.

Since a series parasitic impedance component is included as the parasitic component, matching is provided by providing only an inductive device in the matching device. Especially when the inductive device is an inductance device, the matching device is defined by only an inductance device.

The surface acoustic wave apparatus is preferably configured such that a plurality of surface acoustic wave devices defining the surface acoustic wave filters, the transmission line defining the coupling section of the surface acoustic wave filters, and the matching device are integrally mounted on one circuit board.

The package into which the surface acoustic wave filters are integrated, the external line defining the coupling section, and the matching device, such as an inductance device connected in parallel, are mounted on the same printed circuit board. Therefore, a compact surface acoustic wave multiplexer which does not require an external matching circuit is provided.

Another preferred embodiment of the present invention provides a communication apparatus including a surface acoustic wave apparatus according to preferred embodiments described above as a multiplexer.

Since the surface acoustic wave apparatus is used as a multiplexer, the communication apparatus has outstanding transmission and receiving functions.

Other features, elements, characteristics and advantages of the present invention will become more apparent from the following detailed description of preferred embodiments thereof with reference to the attached drawings.

DETAILED DESCRIPTION OF PREFERRED EMBODIMENTS

A first preferred embodiment of the present invention will be described below by referring to FIG. 1 to FIG. 13. The present invention is not limited to this preferred embodiment.

A surface acoustic wave apparatus according to the first preferred embodiment of the present invention is a surface acoustic wave apparatus that is constructed by integrating at least two surface acoustic wave filters, a first surface acoustic wave filter having relatively low pass-band frequencies and a second surface acoustic wave filter having relatively high pass-band frequencies, into one package, wherein at least signal terminals provided at common terminal sides of the surface acoustic wave filters are connected to different external terminals provided on the package through different paths that are isolated from each other.

Preferably, the signal terminals provided at the common terminal sides of the surface acoustic wave filters is coupled by a transmission line provided on the outside of the package, and a matching circuit is added to this coupling section. Since the matching circuit has a simple structure, the size of the surface acoustic wave apparatus is greatly reduced. The surface acoustic wave apparatus having the above-described structure is used as a multiplexer in a communication apparatus.

Figure 3:
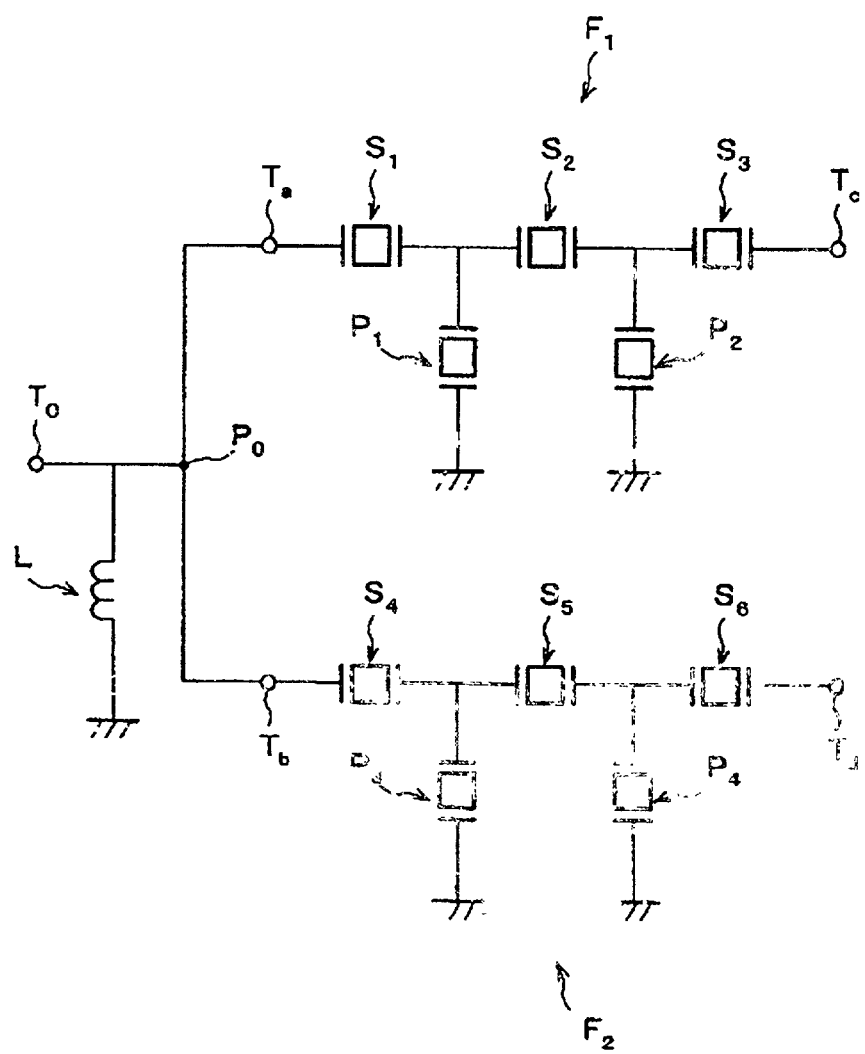
FIG. 3 is an outline view of the structure of the multiplexer shown in FIG. 1.

As shown in FIG. 3, a surface acoustic wave multiplexer (hereinafter referred to simply as a multiplexer) according to the first preferred embodiment of the present embodiment includes a first bandpass filter $F_1$ having relatively low pass-band frequencies and a second bandpass filter $F_2$ having relatively high pass-band frequencies connected in parallel to a common terminal To. Bandpass filters are hereinafter called just filters. Surface acoustic wave resonators are hereinafter called just resonators.

In this preferred embodiment of the present invention, the first filter $F_1$ and the second filter $F_2$ are both ladder-type surface acoustic wave filters including series resonators S connected in series and parallel resonators P connected in parallel that are alternately connected.

More specifically, the first filter $F_1$ includes series resonators $S_1$, $S_2$, and $S_3$, and parallel resonators $P_1$ and $P_2$. The series resonators $S_1$, $S_2$, and $S_3$ are connected to each other in series in that order. The parallel resonators $P_1$ and $P_2$ are connected in parallel to the series resonators $S_1$, $S_2$, and $S_3$, with the parallel resonator $P_1$ between the series resonators $S_1$ and $S_2$, and the parallel resonator $P_2$ between the series resonators $S_2$ and $S_3$.

The second filter $F_2$ includes series resonators $S_4$, $S_5$, and $S_6$, and parallel resonators $P_3$ and $P_4$. The series resonators $S_4$, $S_5$, and $S_6$ are connected to each other in series in that order in the same manner as in the first filter $F_1$. The parallel resonators $P_3$ and $P_4$ are connected in parallel to the series resonators $S_4$, $S_5$, and $S_6$, with the parallel resonator $P_3$ between the series resonators $S_4$ and $S_5$, and the parallel resonator $P_4$ between the series resonators $S_5$ and $S_6$.

The first filter $F_1$ includes a filter signal terminal $T_a$ at the series resonator $S_1$ side and a filter signal terminal $T_c$ at the series resonator $S_3$ side. Similarly, the second filter $F_2$ includes a filter signal terminal $T_b$ at the series resonator $S_4$ side and a filter signal terminal $T_d$ at the series resonator $S_6$ side. The parallel resonators $P_1$ to $P_4$ are connected to the ground.

Among the filter signal terminals, the filter signal terminals $T_a$ and $T_b$ are connected to the common terminal $T_0$ at the connection point $P_0$. Therefore, the filters $F_1$ and $F_2$ are connected in parallel at the common terminal $T_0$. The connection point $P_0$ defines a coupling section for coupling the two filters $F_1$ and $F_2$ with a stripline, as described later.

Figure 2A:
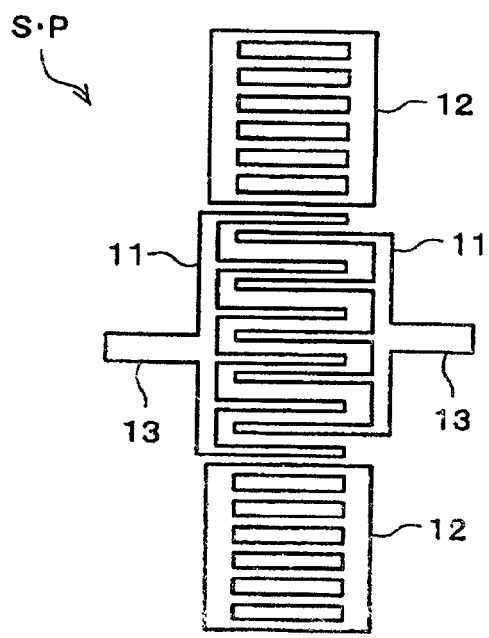
FIG. 2A is a view showing a specific structure of a surface acoustic wave resonator defining the multiplexer shown in FIG. 1.
Figure 17:
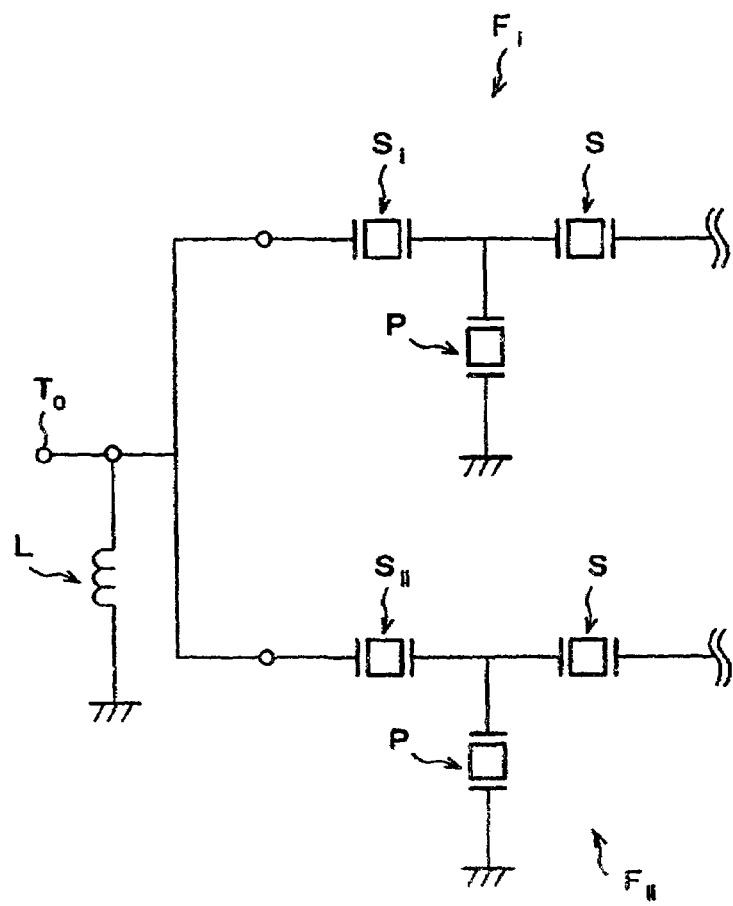
FIG. 17 is an outline view of the structure of a conventional surface acoustic wave multiplexer.

The series resonators $S_1$ to $S_6$ and the parallel resonators $P_1$ to $P_4$ are shown in a sketch manner in FIG. 3 (and FIG. 17, which shows the conventional structure). More specifically, as shown in FIG. 2A, each of the series resonators $S_1$ to $S_6$ and the parallel resonators $P_1$ to $P_4$ is a surface acoustic wave device including comb driving electrodes 11 opposite to each other and reflectors 12 arranged so as to sandwich the comb driving electrodes 11. Alternatively, the resonators S and P may include the comb driving electrodes 11 without using the reflectors 12.

The comb driving electrodes 11 include a plurality of electrode fingers extending from a pair of opposite terminals which are alternately engaged, with a gap between electrode fingers being set to the distance corresponding to a desired resonant frequency. Connection lines 13 are connected to the pair of terminals. A combination of two electrode fingers each extending from the opposite terminals is called a pair of electrode fingers. The number of pairs of electrode fingers defining the comb driving electrodes is appropriately set according to the resonant frequency and other factors. Similarly, the width (overlapping width) where electrode fingers extending from the opposite terminals overlap is also appropriately set according to the resonant frequency and other factors.

Figure 2B:
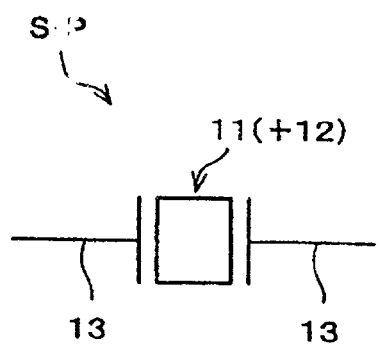
FIG. 2B is an outline view corresponding to FIG. 2A.

FIG. 2B shows the relationship between the structure of the resonators S and P shown in FIG. 2A and the sketch diagram of FIG. 3. A square sandwiched by the connection lines 13 in FIG. 3 is the comb driving electrodes 11 (and the reflectors 12).

The specific structure of the filters $F_1$ and $F_2$ is not limited to the above-described ladder-type structure when the filters are used as surface acoustic wave filters. A conventionally known structure can also be used. The specific structure of the resonators S and P is also not limited to the above-described structure when the resonators define surface acoustic wave devices. A conventionally known structure can be used.

Therefore, an electrode material or a forming method of the resonators S and P is not limited. The resonators may be formed by a conventional forming method using a conventional material, such as Al. A piezoelectric substrate on which the resonators S and P are provided is also not limited. Various piezoelectric substrates, such as a 64-degree-Y-cut, X-propagation LiNbO$_3$ substrate and a 36-degree-Y-cut, X-propagation LiTaO$_3$ substrate, can be used.

The multiplexer according to the first preferred embodiment includes, as described above, filter signal terminals $T_c$ and $T_d$ of the filters $F_1$ and $F_2$, and the common terminal To which connects the filters $F_1$ and $F_2$. Therefore, when the multiplexer is used in a communication apparatus, as described later in a second preferred embodiment, the common terminal $T_0$ is connected to an antenna, and the signal terminals $T_c$ and $T_d$ are connected to transmission devices and receiving devices, respectively. In this manner, the surface acoustic wave apparatus having the above structure is used as a multiplexer.

In the first preferred embodiment of the present invention, the first filter $F_1$ and the second filter $F_2$ are integrated in the same package. The signal line of each of the filters $F_1$ and $F_2$ is led to the outside of the package through separate paths. Therefore, the coupling section (the connection point $P_0$) of the filters $F_1$ and $F_2$ is disposed on the outside of the package.

Figure 1:
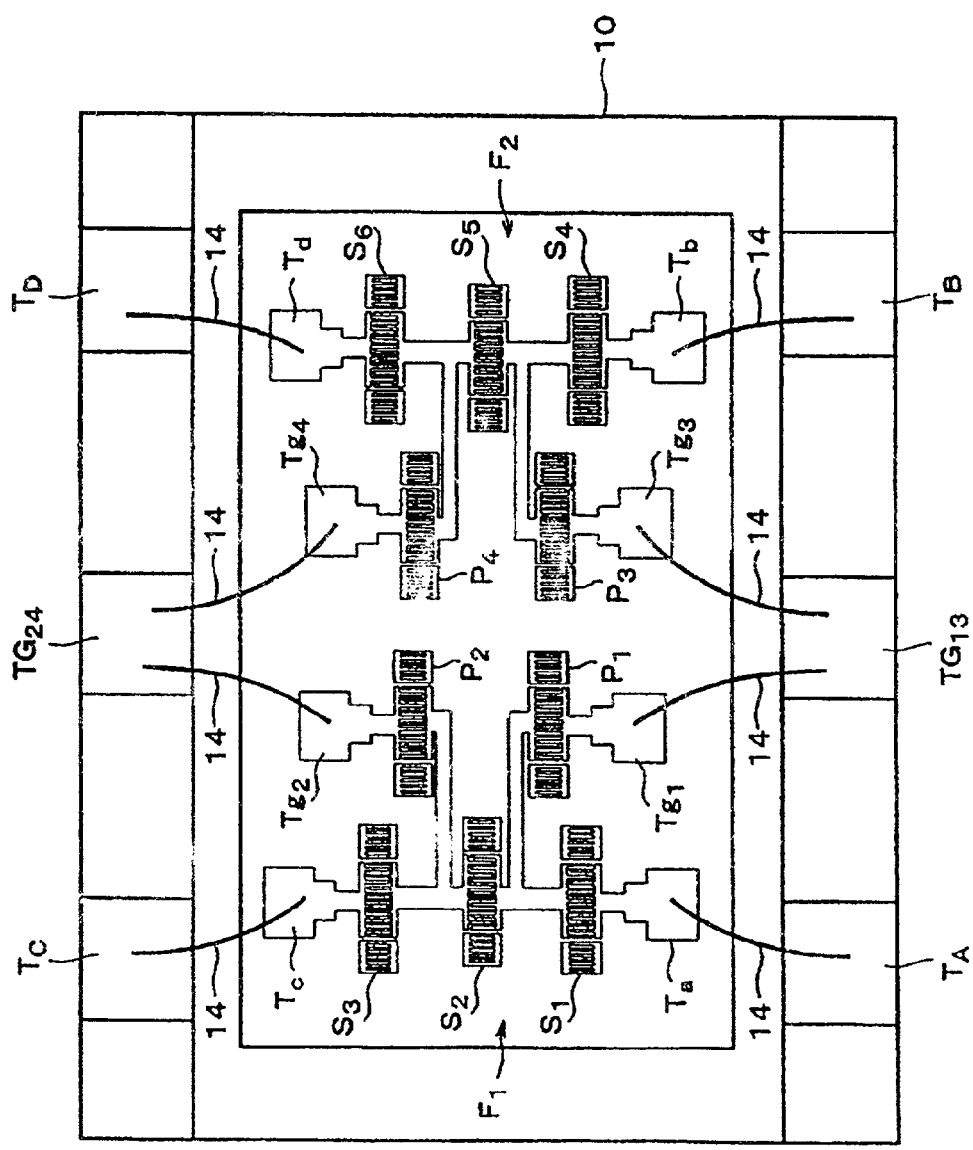
FIG. 1 is an outline view of the structure of a package into which two filters $F_1$ and $F_2$ are integrated, in a surface acoustic wave apparatus defining a multiplexer according to a preferred embodiment the present invention.

Specifically, as shown in FIG. 1, the filters $F_1$ and $F_2$ are configured as shown in the circuit diagram of FIG. 3. The first filter $F_1$ is a ladder type filter in which the series resonators $S_1$ to $S_3$ and the parallel resonators $P_1$ and $P_2$ are alternately connected, and the second filter $F_2$ is also a ladder type filter in which the series resonators $S_4$ to $S_6$ and the parallel resonators $P_3$ and $P_4$ are alternately connected.

In the first preferred embodiment, the filters $F_1$ and $F_2$ are mounted, for example, on a substantially rectangular package 10 in parallel along a longitudinal direction thereof. On the sides of the package in the longitudinal direction, package signal terminals (external terminals) $T_A$, $T_c$, $T_B$, and $T_D$ are provided corresponding to the filter signal terminals $T_a$, $T_c$, $T_b$, and $T_d$ of the filters $F_1$ and $F_2$. The parallel resonators $P_1$ to $P_4$ have filter ground terminals $Tg_1$, $Tg_2$, $Tg_3$, and $Tg_4$. On the sides of the package 10 in the longitudinal direction, package ground terminals $TG_{13}$ and $TG_{24}$ are provided corresponding to the filter ground terminals.

Therefore, the filter signal terminals $T_a$ to $T_d$ and the filter ground terminals $Tg_1$ to $Tg_4$ are connected by wire bonding 14 to the package signal terminals $T_A$ to $T_D$ and the package ground terminals $TG_{13}$ and $TG_{24}$, respectively.

In the present invention, the structure of the package 10 is not limited to that shown in FIG. 1. In other words, the structure of the package 10 is not limited to the structure in which the filters $F_1$ and $F_2$ are disposed in parallel such that the parallel resonators $P_1$ to $P_4$ are opposite each other at an inner portion of the package 10 and the series resonators $S_1$ to $S_3$ and $S_4$ to $S_6$ are disposed at end portions of the package 10 in the longitudinal direction.

In the above-described arrangement, however, since the filter ground terminals $Tg_1$ and $Tg_3$, and the filter ground terminals $Tg_2$ and $Tg_4$ are each arranged opposite to the sides of the package 10 among the four filter ground terminals $Tg_1$ to $Tg_4$ of the filters $F_1$ and $F_2$, only two ground terminals are required on the package 10, the package ground terminal $TG_{13}$ for the filter ground terminals $Tg_1$ and $Tg_3$, and the package ground terminal $TG_{24}$ for the filter ground terminals $Tg_2$ and $Tg_4$. In addition, as described later, the connection structure of ground electrodes is simplified when the package 10 is mounted. As a result, the size of the package 10 is reduced and the structure is simplified.

Figure 4:
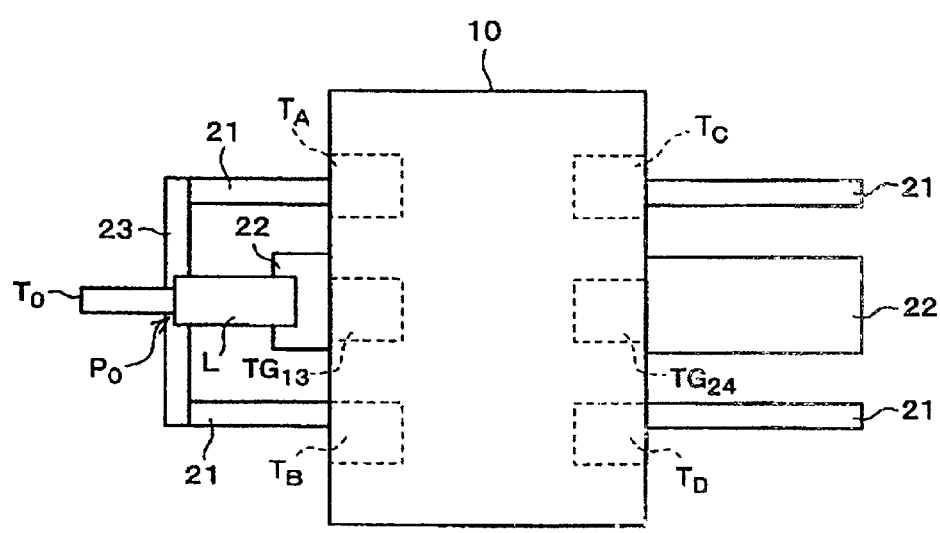
FIG. 4 is an outline view of the structure in which the package shown in FIG. 1 is mounted.

The package 10 having the above-described structure is mounted, for example, as shown in FIG. 4. Specifically, the package signal terminals $T_A$ and $T_C$, and the package terminals $T_B$ and $T_D$ are each connected to signal lines 21 and drawn. The package ground terminals $TG_{13}$ and $TG_{24}$ are connected to a line-shaped ground electrode 22. The signal lines 21 are connected via a stripline 23 at the side of the package signal terminals $T_A$ and $T_B$ to define the connection point $P_0$ (coupling section), and an inductance device L for matching is connected in parallel between the connection point $P_0$ and the ground electrode 22.

In the first preferred embodiment, the inductance device L connected in parallel defines the coupling device. The coupling device is not limited to this device. Alternatively, the coupling device can be a matching circuit having a simplified structure which does not prevent the size of the multiplexer from being reduced. For example, instead of the inductance device L connected in parallel, various matching devices (inductive devices), such as short stubs, which provide inductiveness in the pass bands of the filters $F_1$ and $F_2$ may be connected in parallel.

As described above, in preferred embodiments of the present invention, in the surface acoustic wave multiplexer defined by coupling two surface acoustic wave filters having different pass bands, the surface acoustic wave filters are mounted on one package and the signal lines of each surface acoustic wave filter are provided separately. Therefore, since a series parasitic impedance component generated between the connection point (common connection section) and a point where a matching circuit is connected is substantially eliminated, matching is achieved by providing only an inductance device connected in parallel as the matching circuit. As a result, it is not necessary to provide any additional devices in the matching circuit, and a more compact multiplexer is achieved.

An effect of removing a parasitic component in the first preferred embodiment will be specifically described below with reference to the following example. The present example is merely an example used to specifically describe the effect of the present invention. The present invention is not limited to this example.

In the present example, the filters $F_1$ and $F_2$ having the circuit structure shown in FIG. 3 were arranged to define a surface acoustic wave multiplexer (1) according to a preferred embodiment of the present invention with the package structure shown in FIG. 1 and the mounting structure shown in FIG. 4. As a comparative example, a comparative multiplexer having the same structure as the surface acoustic wave multiplexer (1) except for packaging and mounting which generated a series inductance component was used.

More specifically, in the surface acoustic wave multiplexer (1) (hereinafter referred to simply as a multiplexer (1)), both the first filter $F_1$ and the second filter $F_2$ were ladder type filters, and the filters $F_1$ and $F_2$ were connected in parallel at the common terminal $T_0$ (see FIG. 1, FIG. 3, and FIG. 4). The pass band $f_1$ of the first filter $F_1$ ranged from 1,920 MHz to 1,980 MHz, and the pass band $f_2$ of the second filter $F_2$ ranged from 2,110 MHz to 2,170 MHz.

The filters $F_1$ and $F_2$ were provided on a 64-degree-Y-cut, X-propagation LiNbO$_3$ substrate. On this substrate, an electrode material having Al as a main component was used to form the comb driving electrodes 11 defining the series resonators $S_1$ to $S_6$ and parallel resonators $P_1$ to $P_4$ (see FIG. 2). Table 1 below shows the electrode parameters of the resonators $S_1$ to $S_6$ and $P_1$ to $P_4$. Table 1 also shows the number of pairs and an overlap width in the comb driving electrodes 11 of each resonator.

TABLE 1

| | RESONANT FREQUENCY (MHz) | NUMBER OF PAIRS | OVERLAP WIDTH (μm) |
|---|---|---|---|
| FIRST FILTER $F_1$ | | | |
| SERIES RESONATOR $S_1$ | 1975 | 84 | 50 |
| SERIES RESONATOR $S_2$ | 1975 | 55 | 40 |
| SERIES RESONATOR $S_3$ | 1975 | 84 | 50 |
| PARALLEL RESONATOR $P_1$ | 1865 | 80 | 63 |
| PARALLEL RESONATOR $P_2$ | 1865 | 80 | 63 |
| SECOND FILTER $F_2$ | | | |
| SERIES RESONATOR $S_4$ | 2145 | 90 | 16 |
| SERIES RESONATOR $S_5$ | 2145 | 100 | 22 |
| SERIES RESONATOR $S_6$ | 2145 | 130 | 50 |
| PARALLEL RESONATOR $P_3$ | 2051 | 90 | 60 |
| PARALLEL RESONATOR $P_4$ | 2051 | 90 | 60 |

The filters $F_1$ and $F_2$ were integrated into one package (see FIG. 1), the signal lines 21 were drawn from the filters $F_1$ and $F_2$ through different paths to the outside, and the signal lines 21 were connected at the outside of the package 10 (see FIG. 4). At the connection point $P_0$ of the filters $F_1$ and $F_2$, an inductance device L (3.0 nH) connected in parallel was provided at the outside of the package 10.

Figure 5:
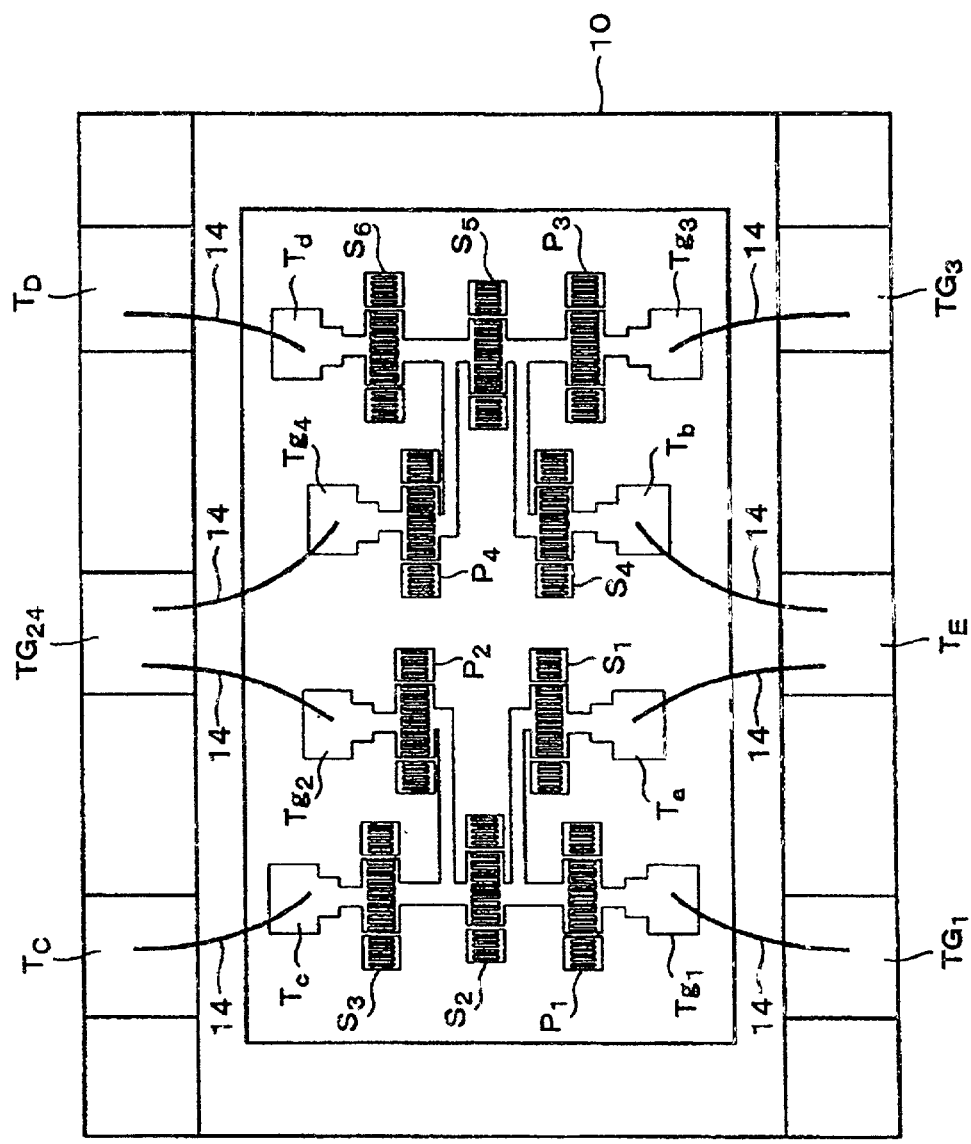
FIG. 5 is an outline view of the structure of a package used in a comparative multiplexer serving as a comparative example of the multiplexer shown in FIG. 1.

The comparative multiplexer shown in FIG. 5 had almost the same package structure as that shown in FIG. 1 with respect to the arrangement of the filters F1 and F2 and the method of wire bonding 14. However, the position of the series resonator $S_1$ and that of the parallel resonator $P_1$ were reversed in the first filter $F_1$, and the position of the series resonator $S_4$ and that of the parallel resonator $P_3$ were reversed in the second filter According to the positions of the resonators, the positions of a signal terminal and ground terminals were also reversed. Specifically, in the package structure shown in FIG. 5, filter ground terminals $Tg_1$ and $Tg_3$ were provided at outer portions in the package whereas filter signal terminals $T_a$ and $T_b$ were provided at inner portions. Therefore, in the comparative multiplexer, instead of the package signal terminals $T_A$ and $T_B$ of the multiplexer (1), a package signal terminal $T_E$ was provided corresponding to the filter signal terminals $T_a$ and $T_b$. In addition, package ground terminals $TG_1$ and $TG_3$ were also provided corresponding to the filter ground terminals $Tg_1$ and $Tg_3$.

Figure 6:
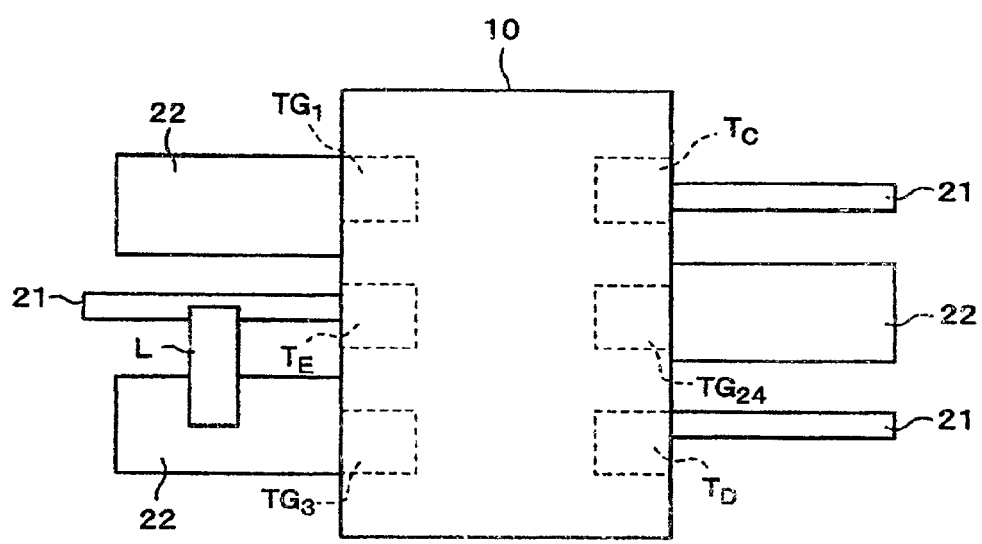
FIG. 6 is an outline view of the structure in which the package shown in FIG. 5 is mounted.

A specific structure in which the above-described package was mounted together with a matching circuit also differed from that of the multiplexer (1), as shown in FIG. 6.

Specifically, since the positions of package signal terminals and a package ground terminal were changed in the comparative multiplexer according to the comparative example, as compared with the mounting structure (see FIG. 4) of the multiplexer (1), the arrangements of the signal lines 21 and the ground electrode 22 were also different. At the side of the package signal terminals $T_C$ and $T_D$, the arrangements of the signal lines 21 and the ground electrode 22 were the same as those in the multiplexer (1). At the side of the package signal terminal $T_E$, a signal line 21 was disposed at an inner portion and ground electrodes 22 were disposed at outer portions. Therefore, the stripline 23 was not provided, and an inductance device L connected in parallel is added to connect the signal line 21 to one of the ground electrodes 22.

In the comparative multiplexer having the above-described structure, an impedance component $Z_0$ serving as a series parasitic component was generated between the package signal terminal $T_E$ and the inductance device L. As a result, the impedance of the comparative multiplexer is shifted toward a lower-impedance side.

Figure 7:
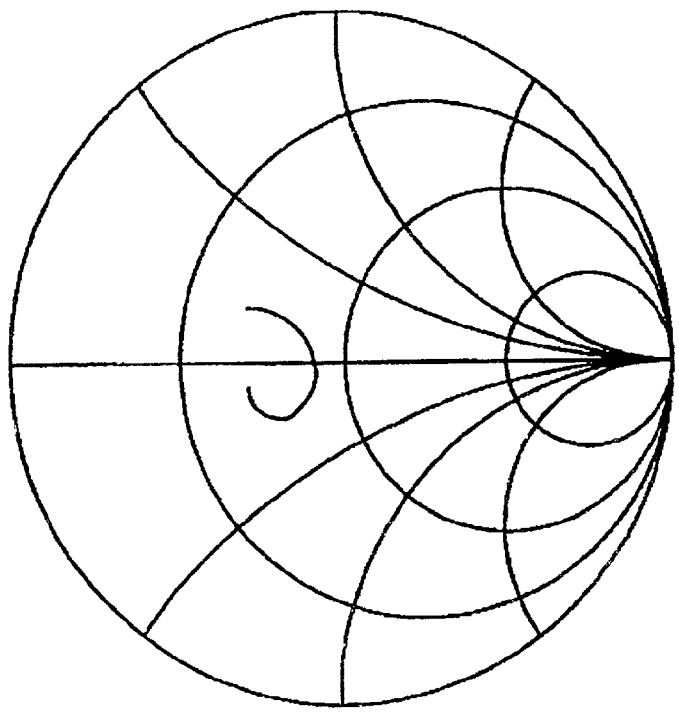
FIG. 7 is a Smith chart showing the impedance characteristic of the multiplexer having the structure shown in FIG. 1 and FIG. 4 according to preferred embodiments of the present invention.
Figure 8:
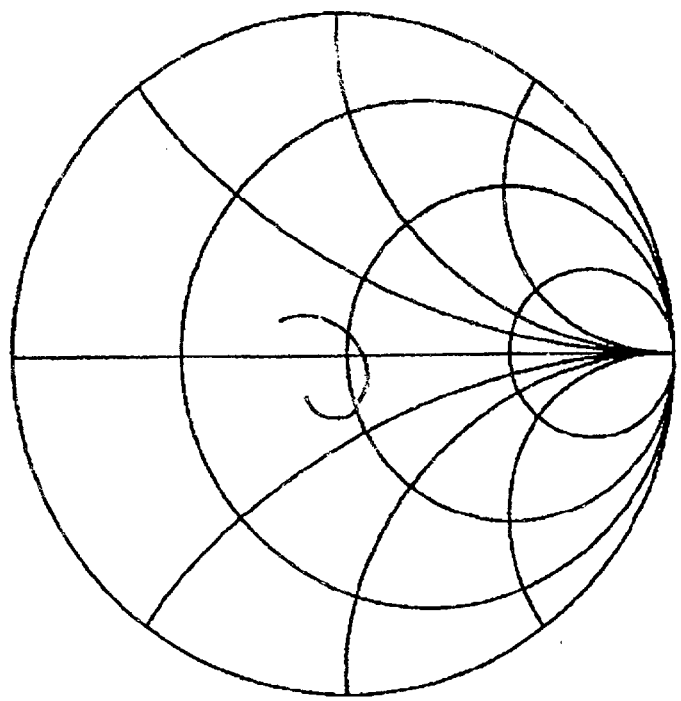
FIG. 8 is a Smith chart showing the impedance characteristic of the comparative multiplexer having the structure shown in FIG. 5 and FIG. 6 according to preferred embodiments of the present invention.

FIG. 7 is a Smith chart showing the reflection characteristic of the multiplexer (1) in the pass band $f_1$ of the first filter $F_1$, viewed from the common terminal To. FIG. 8 is a Smith chart showing the reflection characteristic of the comparative multiplexer in the pass band $f_1$ of the first filter $F_1$, viewed from the common terminal To. In the Smith charts of FIG. 7 and FIG. 8, the center points correspond to 50Ω, and the closer a reflection characteristic is to the center, the more successful the obtained matching is.

As clearly shown in FIG. 7, that the impedance of the multiplexer (1) according to a preferred embodiment of the present invention is in the vicinity of about 50Ω, and matching is obtained. As clearly shown in FIG. 8, the impedance of the comparative multiplexer is shifted toward a lower-impedance side due to the series parasitic component.

Figure 9:
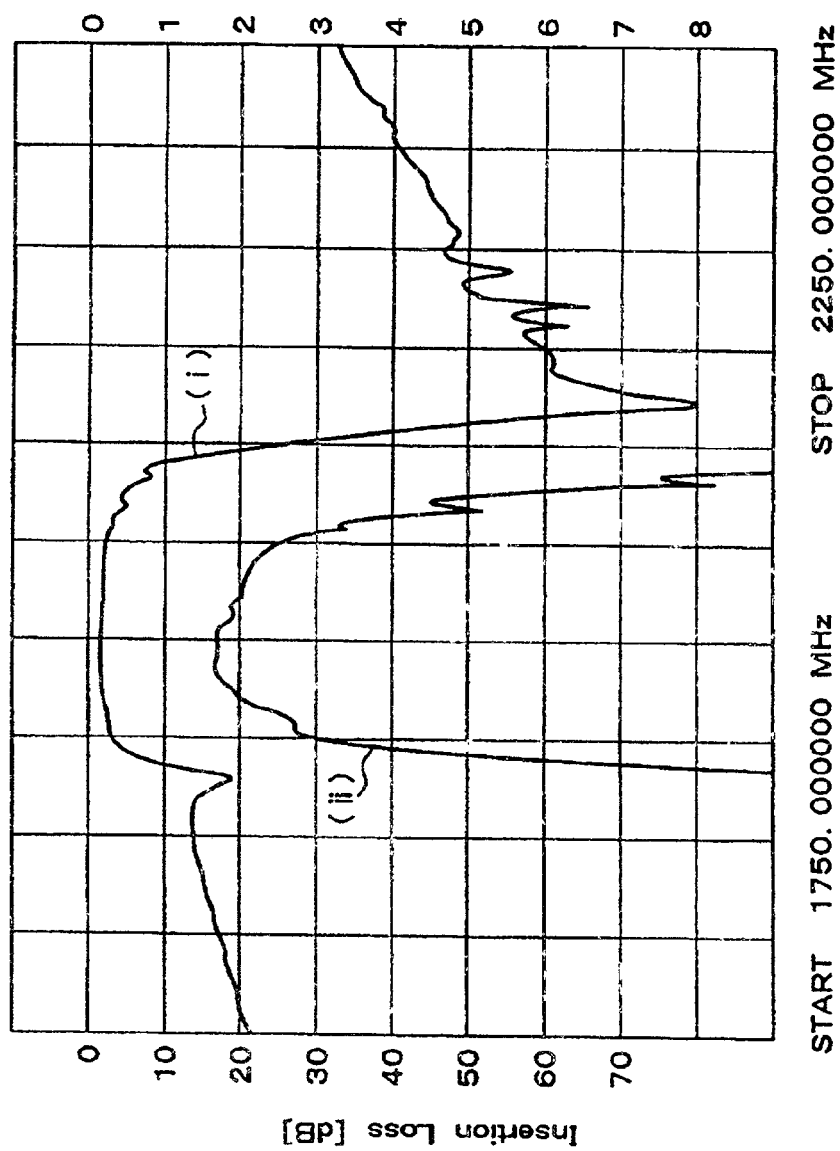
FIG. 9 is a graph showing the transmission characteristic of a first filter in the multiplexer having the structure shown in FIG. 1 and FIG. 4 according to preferred embodiments of the present invention.
Figure 10:
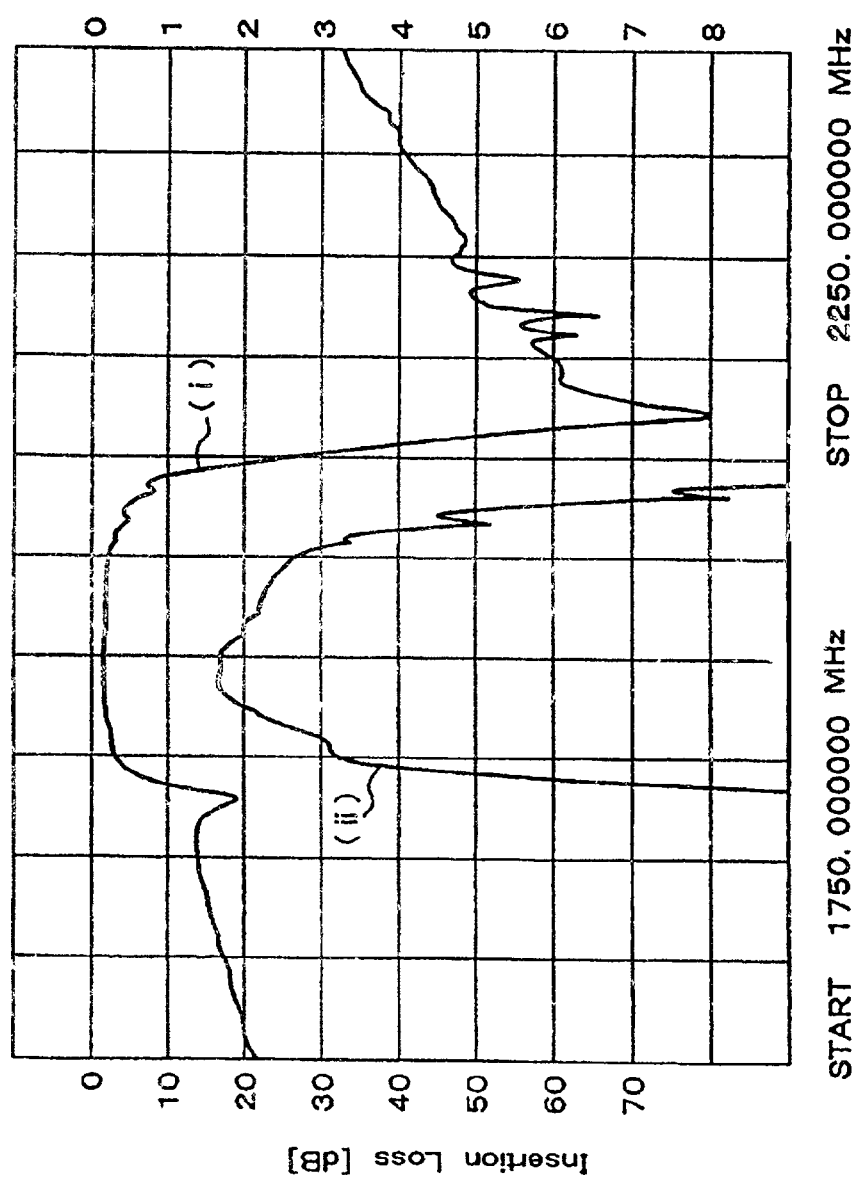
FIG. 10 is a graph showing the transmission characteristic of a first filter in the comparative multiplexer having the structure shown in FIG. 5 and FIG. 6.

FIG. 9 and FIG. 10 are characteristic graphs of the transmission characteristics of the first filters F1 of the multiplexer (1) and the comparative multiplexer, respectively. In each characteristic graph, (i) indicates an insertion loss (unit: dB at the left-hand side vertical axis) and (ii) indicates an enlarged view of the insertion loss (unit: dB at the right-hand side vertical axis). The horizontal axis indicates the frequency ranging from 1,750 MHz to 2,250 MHz.

Figure 11:
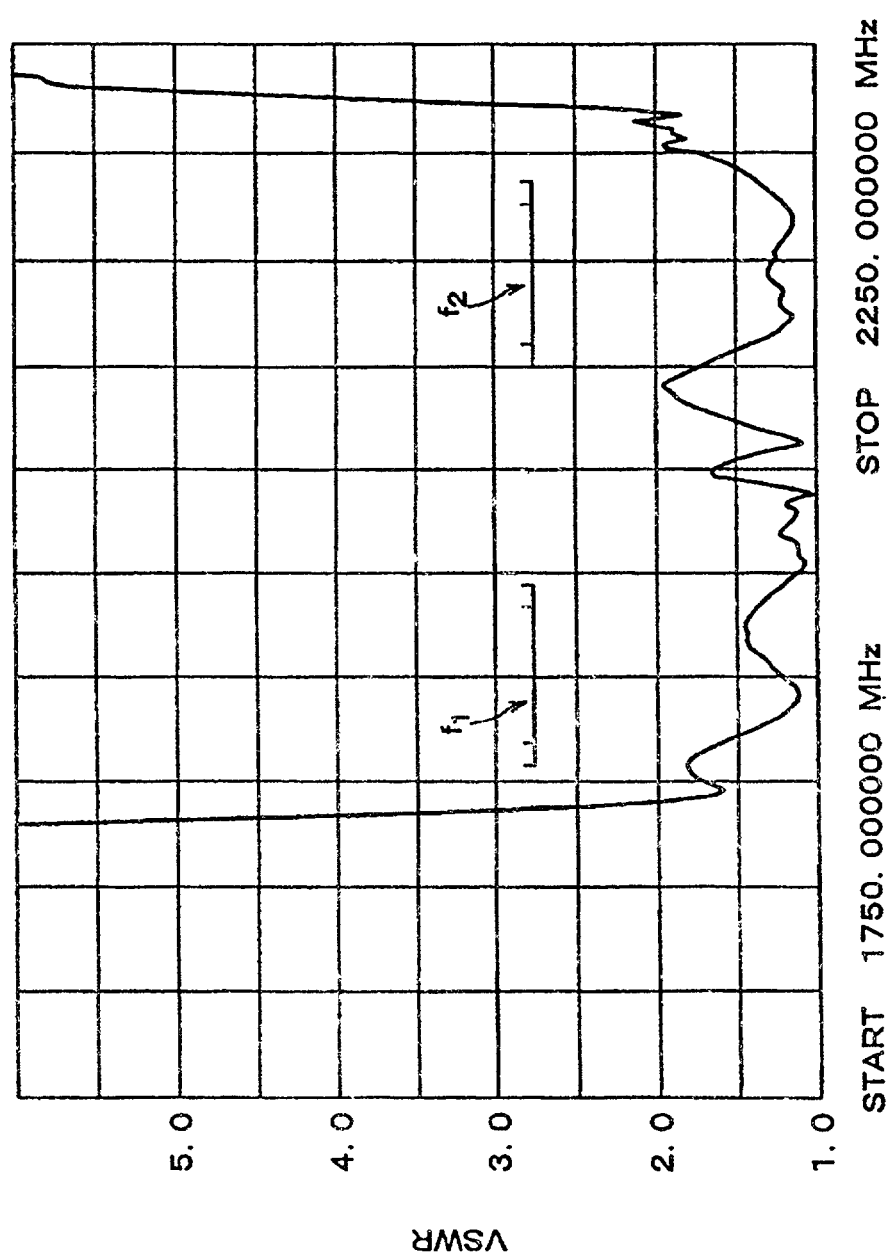
FIG. 11 is a graph showing VSWR changes viewed from a common terminal in the multiplexer having the structure shown in FIG. 1 and FIG. 4 according to preferred embodiments of the present invention.
Figure 12:
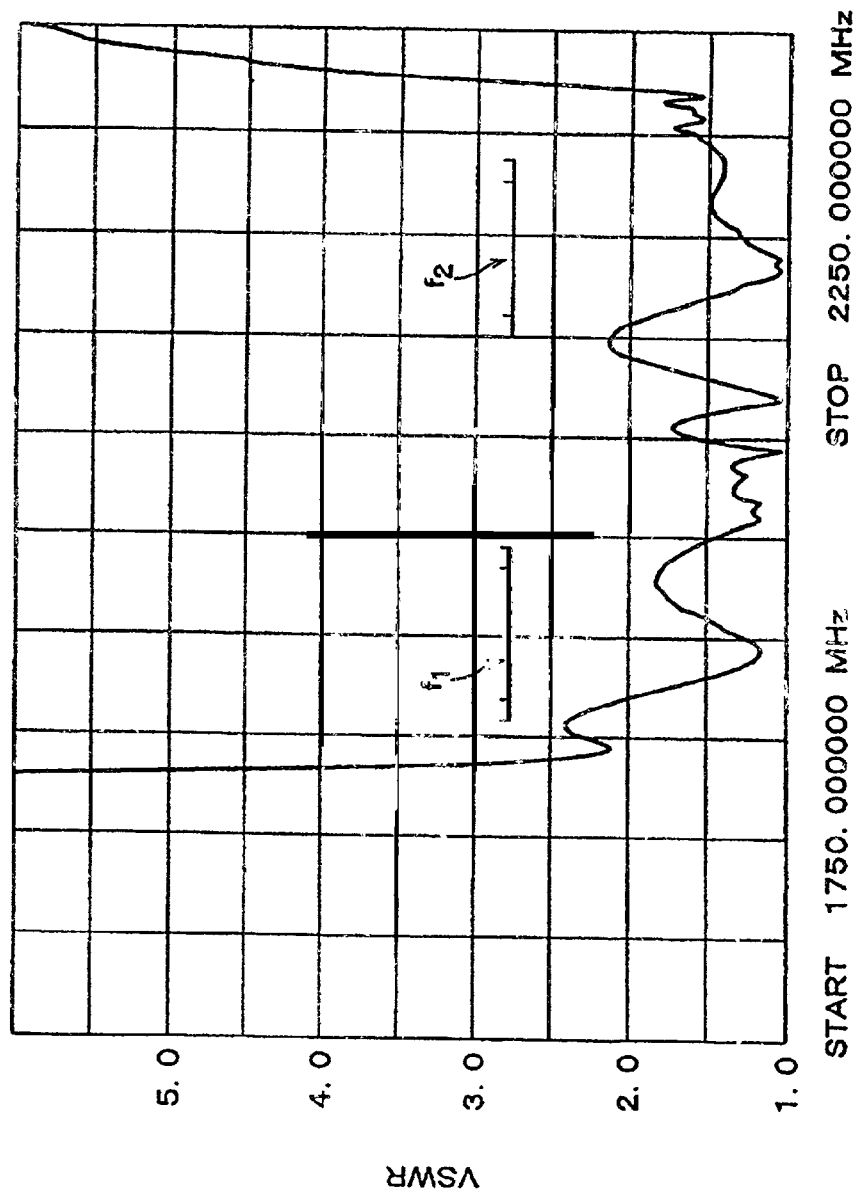
FIG. 12 is a graph showing VSWR changes viewed from a common terminal in the comparative multiplexer having the structure shown in FIG. 5 and FIG. 6.

FIG. 11 and FIG. 12 are graphs showing the voltage standing-wave ratio (VSWR) of the multiplexer (1) and the comparative multiplexer, respectively, viewed from the common terminals To. In each graph, $f_1$ indicates the pass band of the first filter $F_1$ and $f_2$ indicates the pass band of the second filter $F_2$. The vertical axis indicates VSWR, and the horizontal axis indicates the frequency ranging from 1,750 MHz to 2,250 MHz.

Both of the multiplexer (1) according to a preferred embodiment of the present invention and the comparative multiplexer have similar characteristics in FIG. 9 and FIG. 10. Since VSWR in FIG. 12 is worse than that in FIG. 11, the comparative multiplexer did not obtain successful matching.

The extent to which the characteristics of a multiplexer deteriorate due to the series parasitic impedance component was examined next.

Figure 13:
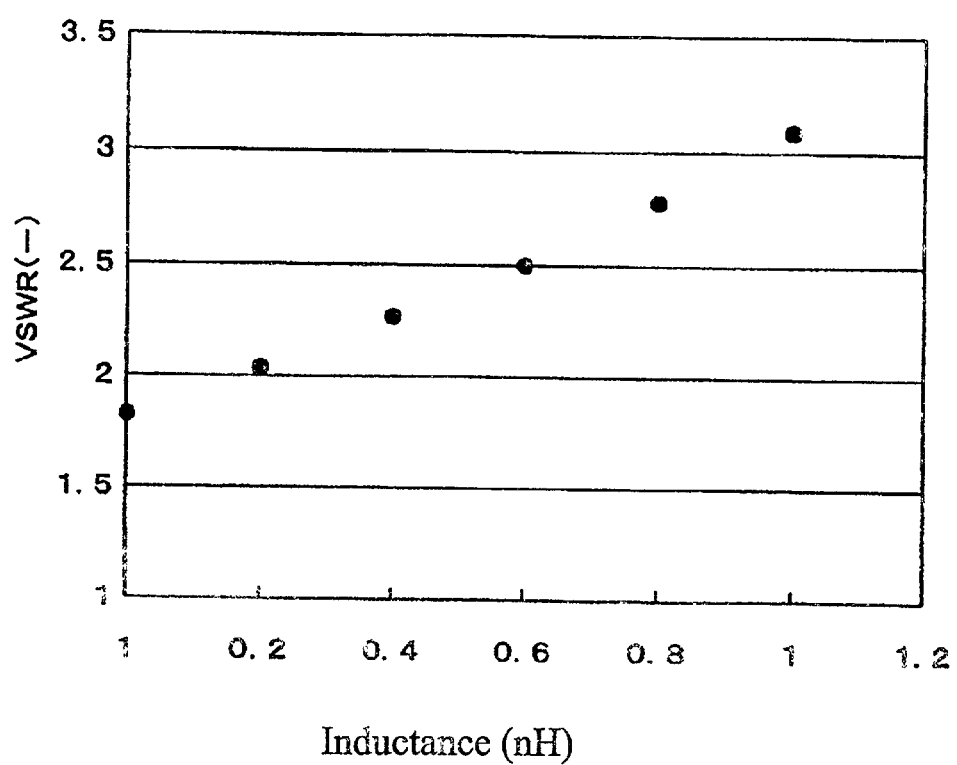
FIG. 13 is a graph showing the relationship between the inductance of a parasitic impedance component and VSWR in preferred embodiments of the present invention.
Figure 18:
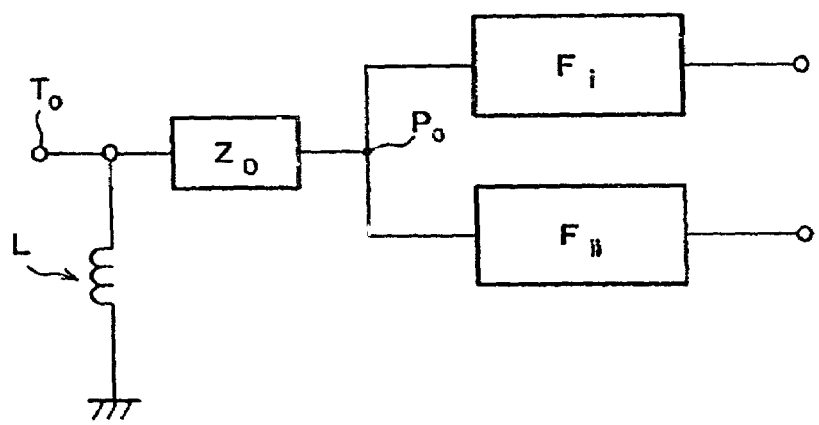
FIG. 18 is a view showing a state in which the conventional surface acoustic wave multiplexer includes a series parasitic impedance component.
Figure 19:
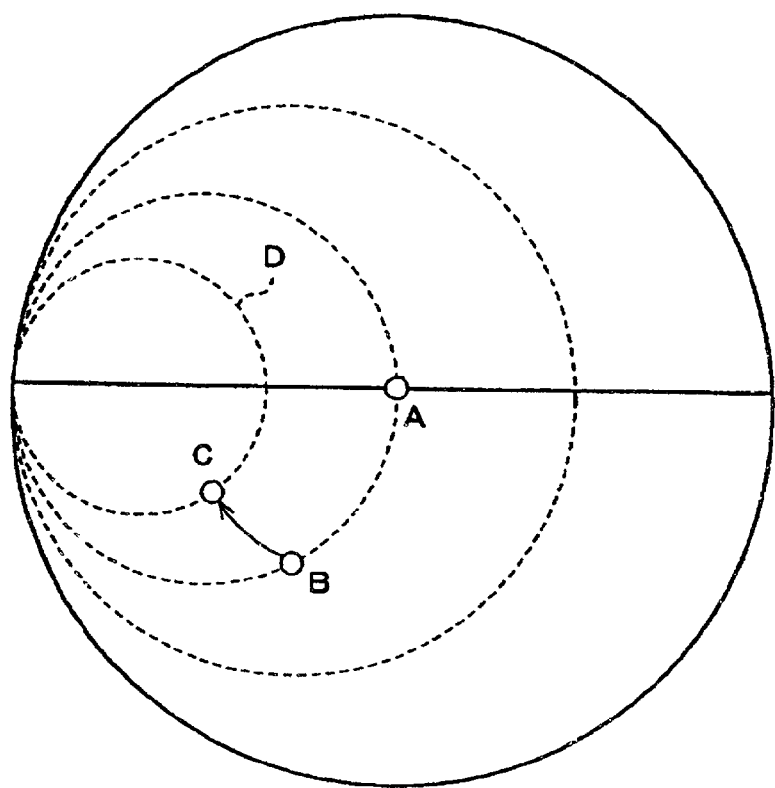
FIG. 19 is an admittance chart showing changes in admittance characteristic in a state in which the parasitic impedance component shown in FIG. 18 is included.

Specifically, the inductance of the parasitic impedance component $Z_0$ (see FIG. 18) was changed from 0 nH to 1.0 nH in steps of 0.2 nH. FIG. 13 shows the relationship between the inductance and the VSWR, which shows changes in the reflection characteristic. With ±20 MHz being taken into consideration as a frequency temperature dependence and a manufacturing tolerance in the pass band of the first filter $F_1$, the maximum VSWR points were obtained in the range from 1,900 MHz to 2,000 MHz.

As clearly shown in FIG. 13, no problem occurred when there is no inductance ($Z_0$ =0 nH), but if a small inductance (for example, $Z_0$=0.2 nH) was generated, the deterioration of the reflection characteristic began.

Since a multiplexer must be small, it is necessary for preferred embodiments of the present invention to provide matching on the outside without increasing the number of matching devices. In such a structure, however, if a parasitic component having an inductance as small as about 0.2 nH is generated, it is very difficult to remove a component. Therefore, conventionally, a number of matching devices were provided at the connection point $P_0$.

In contrast, in preferred embodiments of the present invention, the signal lines 21 are drawn to the outside through different paths, are connected at the outside, and the matching device (only the inductance device L connected in parallel) is connected to the coupling section (connection point $P_0$). Therefore, without providing an additional matching device, the parasitic component is effectively eliminated. As a result, the reflection characteristic of the multiplexer is greatly improved.

A second preferred embodiment of the present invention will be described below by referring to FIG. 14 and FIG. 15. The present invention is not limited to this case. For convenience of description, the same numerals as those used in the first preferred embodiment are assigned to portions having the same functions as those used in the first preferred embodiment, and descriptions thereof are omitted.

The second preferred embodiment preferably has the same basic structure as the first preferred embodiment, however a package 10 and a matching circuit are mounted on one of various circuit boards.

Figure 14:
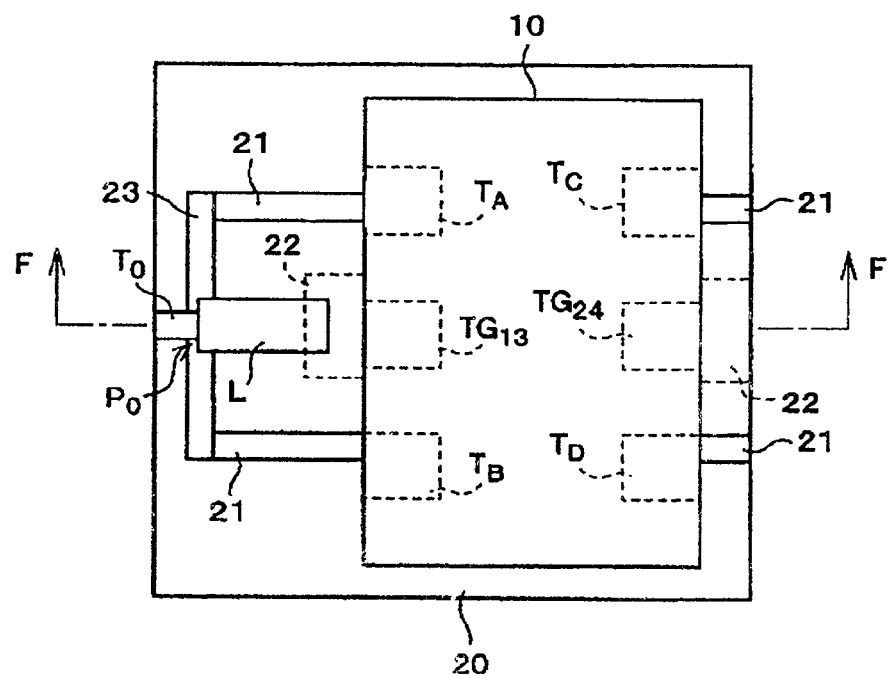
FIG. 14 is an outline plan viewed from the top, showing another package structure of the surface acoustic wave multiplexer serving as a surface acoustic wave apparatus according to another preferred embodiments of the present invention.
Figure 15:
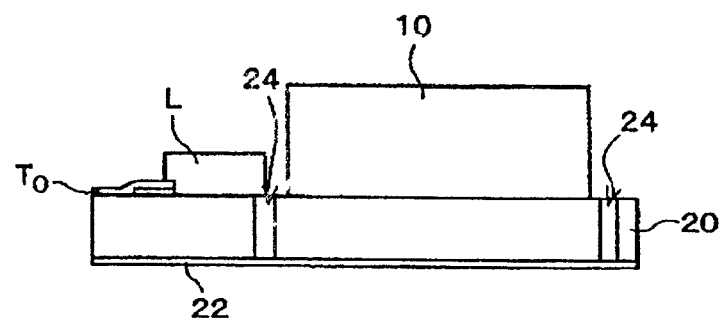
FIG. 15 is a sectional view on line F—F of the outlined plan shown in FIG. 14.

More specifically, as shown in FIG. 14 and FIG. 15, a surface acoustic wave apparatus according to the second preferred embodiment includes a package 10 and an inductance device L connected in parallel, to define a matching circuit, that are mounted on a printed circuit board 20. FIG. 14 is a plan showing a state in which the package 10 and the inductance device L are mounted, and FIG. 15 is a sectional view on line F—F shown in FIG. 14.

As described in the first preferred embodiment, the package 10 includes a first filter $F_1$ and a second filter $F_2$, and filter signal terminals $T_a$ to $T_d$ of the filters $F_1$ and $F_2$ are connected to separate package signal terminals $T_A$ to $T_D$, respectively. Signal lines 21 and a ground electrode 22 are connected to signal terminals and ground terminals in the same manner as described above by referring to FIG. 4.

In the second preferred embodiment, however, since the package 10 and the inductance device L are mounted on the printed circuit board 20, the first filter $F_1$, the second filter $F_2$, and the inductance device L (coupling circuit) are collectively mounted on one circuit board.

In other words, a plurality of resonators (surface acoustic wave devices) S and P defining the filters $F_1$ and $F_2$, a stripline 23 for connecting the filters $F_1$ and $F_2$, and the inductance device L connected in parallel for matching are integrally mounted on one printed circuit board 20 (circuit board). Therefore, the size of the multiplexer is reduced and is not externally connected to a matching circuit (matching device). Thus, the mounting condition is stabilized.

In the second preferred embodiment, as shown in FIG. 15, the ground electrode 22 is provided at a rear surface of the printed circuit board 20, and through holes 24 are provided for the printed circuit board 20. Since the filters $F_1$ and $F_2$ mounted in the package 10 and the inductance device L are electrically connected to the ground electrode 22 on the rear surface of the printed circuit board 20 through the through holes 24, they can be connected to the ground potential.

A circuit board on which the package 10, the stripline 23, and the inductance device L are mounted is not limited to the printed circuit board 20. For example, a ceramic multilayer board or a ceramic multilayer module circuit board can be used.

Further, in the second preferred embodiment, as in the first preferred embodiment, the inductance device L connected in parallel defines a matching circuit and the inductance device L is an external independent device. The matching circuit is not limited to the inductance device L. For example, various matching circuits, such as an inductance component connected in parallel, may be provided in the printed circuit board 20, a ceramic multilayer board, or a ceramic multilayer module circuit board.

As described above, in the second preferred embodiment, in addition to the structure described in the first preferred embodiment, the package which includes the surface acoustic wave filters, and a matching circuit such as the inductance device connected in parallel are mounted on one printed circuit board. Therefore, a compact surface acoustic wave multiplexer is provided without an external matching circuit.

In the first and second preferred embodiments, the ladder-type filters are used as examples of surface acoustic wave filters. The present invention is not limited to the ladder-type filters. The same functions and advantages are obtained by using filters made by other design methods, such as a longitudinally coupled resonant filter.

Specific results are not shown, however a multiplexer according to the second preferred embodiment was manufactured under the same conditions, such as the pass bands $f_1$ and $f_2$ of the filters $F_1$ and $F_2$, and the configuration and structure of each resonator, similar to the above example of the first preferred embodiment. As a result, a multiplexer having no series parasitic component between the connection point $P_0$ and the inductance device L connected in parallel was obtained. Therefore, even with the structure of the second embodiment, a multiplexer having outstanding filter characteristics without impeding a reflection characteristic and having a successful matching is obtained.

A third preferred embodiment of the present invention will be described below by referring to FIG. 16. The present invention is not limited to this case. For convenience of description, the same numerals as those used in the first or second preferred embodiments are assigned to portions having the same functions as those used in the first or second preferred embodiments, and descriptions thereof are omitted.

In the third preferred embodiment, a multiplexer according to the first or second preferred embodiments included in a communication apparatus will be specifically described.

Figure 16:
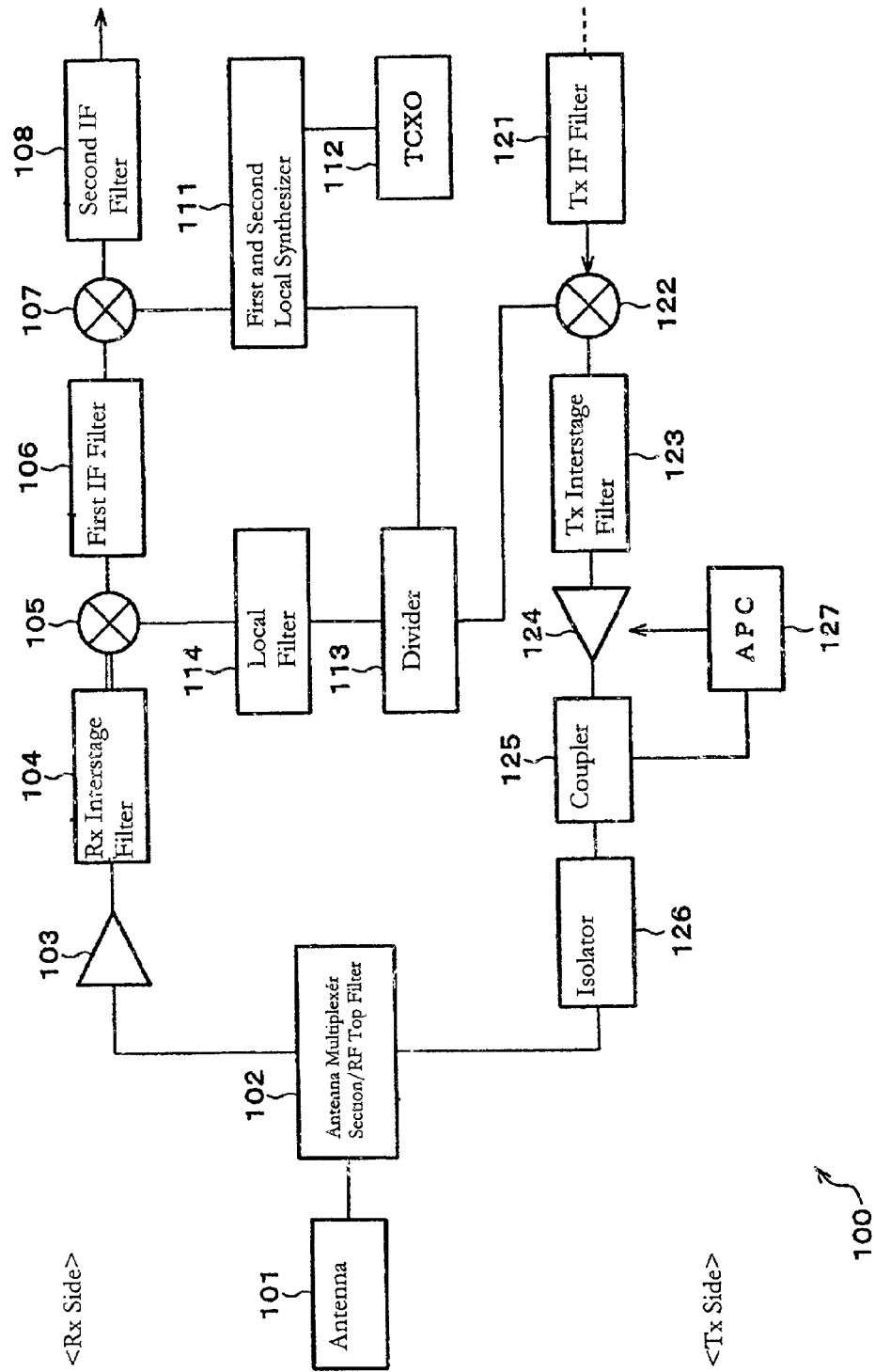
FIG. 16 is a block diagram of main sections of a communication apparatus according to another preferred embodiment of the present invention.

As shown in FIG. 16, a communication apparatus 100 according to the third preferred embodiment includes, at a receiver side (Rx side) for receiving, an antenna 101, an antenna multiplexer section/RF top filter 102, an amplifier 103, an Rx interstage filter 104, a mixer 105, a first IF filter 106, a mixer 107, a second IF filter 108, a first+second local synthesizer 111, a temperature compensated crystal oscillator (TCXO) 112, a divider 113, and a local filter 114.

The communication apparatus 100 also includes, at a transmission side (Tx side) for transmission, the antenna 101 and the antenna multiplexer section/RF top filter 102, which are shared with the receiver side, a Tx IF filter 121, a mixer 122, a Tx interstage filter 123, an amplifier 124, a coupler 125, an isolator 126, and an automatic power control (APC) 127.

As the antenna multiplexer section/RF top filter 102, the surface acoustic wave multiplexer according to the first or second preferred embodiments is provided.

As described above, since the communication apparatus according to the third preferred embodiment includes the surface acoustic wave multiplexer according to the first or second preferred embodiment, the communication apparatus exhibits outstanding transmission and receiving functions.

As described above, a surface acoustic wave apparatus according to the present invention includes two surface acoustic wave filters that are integrated into one package and are connected to one common terminal, and signal terminals of the surface acoustic wave filters, at the common terminal side, are connected to different external terminals of the package through different paths insulated from each other.

In the above-described configuration, since signal terminals of the surface acoustic wave filters are separately drawn to the outside of the package, a series parasitic component generated between a connection point (coupling section) and a point where a matching circuit is connected is substantially eliminated. Therefore, the structure of the matching circuit is greatly simplified. As a result, because it is not necessary to provide additional devices in the matching circuit, the size of the surface acoustic wave apparatus is greatly reduced, and the surface acoustic wave apparatus according to preferred embodiments of the present invention is suitable for a multiplexer in a communication apparatus.

In addition to the above-described structure, the surface acoustic wave apparatus according to preferred embodiments of the present invention includes the surface acoustic wave filters that are connected to one common terminal through paths outside the package to define a coupling section, and a matching device is connected in parallel to the surface acoustic wave filters in the coupling section.

According to the above-described structure, since the coupling section is provided outside the package, the above-described series parasitic component is eliminated. Therefore, the size of the matching device is greatly reduced. As a result, the size of a surface acoustic wave apparatus and a multiplexer including the matching device is greatly reduced.

In addition to the above-described structure, the surface acoustic wave apparatus according to preferred embodiments of present invention includes a matching device having an inductive device which provides inductiveness in the pass bands of the surface acoustic wave filters. Preferably, the inductive device is defined by an inductance device, and the matching device is defined by only the inductance device.

According to each of the above-described structures, since a series parasitic impedance component is included as the parasitic component, matching is achieved by including an inductive device in the matching device. Especially when the inductive device is an inductance device, the matching device is substantially defined by only an inductance device.

In addition to the above-described structure, the surface acoustic wave apparatus according to preferred embodiments of the present invention includes a plurality of surface acoustic wave devices defining the surface acoustic wave filters, the line defining the coupling section of the surface acoustic wave filters, and the matching device are integrally mounted on one circuit board.

According to the above-described structure, the package into which the surface acoustic wave filters are integrated, the external line defining the coupling section, and the matching device, such as an inductance device connected in parallel, are mounted on the same printed circuit board. Therefore, a compact surface acoustic wave multiplexer which does not require an external matching circuit is provided.

A communication apparatus according to the third preferred embodiment of the present invention includes a surface acoustic wave apparatus having the above-described structure is provided as a multiplexer.

According to the above-described structure, since the surface acoustic wave apparatus is provided as a multiplexer, the communication apparatus has outstanding transmission and receiving functions.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave apparatus comprising:
 a package having external terminals;
 a first surface acoustic wave filter including signal terminals and having relatively low pass-band frequencies; and
 a second surface acoustic wave filter including signal terminals and having relatively high pass-band frequencies; wherein
 the first and second surface acoustic wave filters are integrated into the package;
 one signal, terminal of each of the first and second surface acoustic wave filters is connected to a common terminal;
 the signal terminals, disposed at the common terminal sides, of the respective first and second surface acoustic wave filters are connected to different external terminals of the package through different paths that are isolated from each other, and each of the signal terminals is connected by a signal line of an external circuit;
 the first and second surface acoustic wave filters are connected to the common terminal through a transmission line outside the package;
 the common terminal and the transmission line define a coupling section located outside of the package such that the common terminal and the transmission line are spaced outwardly away from a side surface of the package; and
 a matching device is connected in parallel to the first and second surface acoustic wave filters, at the coupling section located outside of and spaced away from the package.

2. A surface acoustic wave apparatus according to claim 1, wherein a plurality of surface acoustic wave devices defining the first and second surface acoustic wave filters, the transmission line defining the coupling section of the first and second surface acoustic wave filters, and the matching device are integrally mounted on one circuit board.

3. A surface acoustic wave apparatus according to claim 1, wherein the matching device includes an inductive device which provides inductiveness in the pass bands of the first and second surface acoustic wave filters.

4. A surface acoustic wave apparatus according to claim 3, wherein a plurality of surface acoustic wave devices defining the first and second surface acoustic wave filters, the transmission line defining the coupling section of the first and second surface acoustic wave filters, and the matching device are mounted on one circuit board and integrated with each other to define a single unitary member.

5. A surface acoustic wave apparatus according to claim 3, wherein the inductive device is an inductance device, and the matching device is defined by only the inductance device.

6. A surface acoustic wave apparatus according to claim 5, wherein a plurality of surface acoustic wave devices defining the first and second surface acoustic wave filters, the transmission line defining the coupling section of the first and second surface acoustic wave filters, and the matching device are mounted on one circuit board and integrated with each other to define a single unitary member.

7. A surface acoustic wave apparatus according to claim 1, wherein the first and second surface acoustic wave filters are ladder-type surface acoustic wave filters.

8. A surface acoustic wave apparatus according to claim 1, wherein the first surface acoustic wave filter includes series resonators and parallel resonators arranged such that the parallel resonators are connected in parallel with the series resonators.

9. A surface acoustic wave apparatus according to claim 1, wherein the second surface acoustic wave filter includes series resonators and parallel resonators arranged such that the parallel resonators are connected in parallel with the series resonators.

10. A surface acoustic wave apparatus according to claim 1, wherein the first and second surface acoustic wave filters include a 64-degree-Y-cut, X-propagation $LiNbO_3$ substrate.

11. A surface acoustic wave apparatus according to claim 1, wherein the first and second surface acoustic wave filters include a 36-degree-Y-cut, X-propagation $LiTaO_3$ substrate.

12. A communication apparatus comprising a surface acoustic wave apparatus according to claim 1 arranged to define a multiplexer.

13. A surface acoustic wave apparatus comprising:
a package having external terminals;
a bandpass filter including signal terminals and having relatively low pass-band frequencies provided in the package; and
a bandpass filter including signal terminals and having relatively high pass-band frequencies provided in the package;
wherein a signal terminal of each of the first and second bandpass filters are connected to one another; and
at least one of said signal terminals of each of the first and second bandpass filters is connected to a respective different external terminal of the package through different paths Isolated from each other, and each of the signal terminals is connected by a signal line of an external circuit; wherein
the first and second bandpass filters are connected to a common terminal through a transmission line outside the package;
the common terminal and the transmission line define a coupling section located outside of the package such that the common terminal and the transmission line are spaced outwardly away from a side surface of the package; and
a matching device is connected in parallel to the first and second bandpass filters at the coupling section located outside of and spaced away from the package.

14. A surface acoustic wave apparatus according to claim 13, wherein a plurality of surface acoustic wave devices defining the first and second bandpass filters, the transmission line defining the coupling section of the first and second bandpass filters, and the matching device are integrally mounted on one circuit board.

15. A surface acoustic wave apparatus according to claim 13, wherein the matching device includes an inductive device which provides inductiveness in the pass bands of the first and second surface acoustic wave filters.

16. A surface acoustic wave apparatus according to claim 13, wherein a plurality of surface acoustic wave devices defining the first and second bandpass filters, the transmission line defining the coupling section of the first and second bandpass filters, and the matching device are mounted on one circuit board and integrated together in a single unitary member.

17. A surface acoustic wave apparatus according to claim 15, wherein the inductive device is an inductance device, and the matching device is defined by only the inductance device.

18. A communication apparatus comprising a surface acoustic wave apparatus according to claim 13 that is arranged to define a multiplexer.

19. A surface acoustic wave apparatus according to claim 1, wherein the package and the matching device are disposed on a first major surface of a circuit board; and
the package and the matching device are connected to an electrode disposed on a second major surface of the circuit via through-holes.

20. A surface acoustic wave apparatus according to claim 13, wherein the package and the matching device are disposed on a first major surface of a circuit board; and
the package and the matching device are connected to an electrode disposed on a second major surface of the circuit via through-holes.

* * * * *